United States Patent [19]

O'Neill

[11] Patent Number: 4,985,683
[45] Date of Patent: Jan. 15, 1991

[54] CIRCUITRY FOR MEASURING PHASE DIFFERENCE BETWEEN TWO OSCILLATORY SIGNALS

[75] Inventor: Michael J. O'Neill, Ridgefield, Conn.

[73] Assignee: The Perkin-Elmer Corporation, Norwalk, Conn.

[21] Appl. No.: 173,201

[22] Filed: Mar. 24, 1988

[51] Int. Cl.$^5$ .............................. H03K 9/06; G05F 5/00
[52] U.S. Cl. ................................. 328/133; 328/155; 307/262; 307/511
[58] Field of Search ................ 328/133, 155, 127; 307/511, 514, 262

[56] References Cited

U.S. PATENT DOCUMENTS

| | | | |
|---|---|---|---|
| 2,826,988 | 7/1974 | Wise et al. | 328/133 |
| 3,589,167 | 6/1971 | Hill | 73/16 |
| 3,750,035 | 7/1973 | Crow | 328/133 |
| 4,020,422 | 4/1977 | Underhill | 328/133 |
| 4,247,823 | 1/1981 | VunKannon, Jr. | 328/127 |
| 4,333,055 | 6/1982 | Crackel | 328/133 |
| 4,354,764 | 10/1982 | Achermann et al. | 374/56 |
| 4,358,736 | 11/1982 | DeBoer | 328/133 |
| 4,520,321 | 5/1985 | Nakatsugawa et al. | 328/133 |

Primary Examiner—Timothy P. Callahan
Attorney, Agent, or Firm—H. S. Ingham; E. T. Grimes

[57] ABSTRACT

In an electrical circuitry a sinusoidal wave to and an associated wave with the same frequency are represented by square waves which are combined to form pulsed time signals representing a phase difference for each half cycle. A pair of analog switches are receptive of the control voltage and responsive to the respective time signals, to feed a switched output to an integrating capacitor such that successive voltage levels are effected in proportion to the time signals and the control voltage. Sample hold modules receptive of the voltage levels effect a steady voltage output representative of average phase shift independently of operating frequency and any time-varying DC level in the associated wave. The sinusoidal wave is generated by combining a triangular wave with an alternating wave equal in magnitude to about half of the square of the triangular wave. The triangular wave is generated with a control voltage proportional to the operating frequency. The associated wave is amplified by an active filter circuit with corner frequencies approximately equal to each other and proportional to the operating frequency to process the wave independently of frequency.

20 Claims, 6 Drawing Sheets

CIRCUITRY FOR MEASURING PHASE DIFFERENCE BETWEEN TWO OSCILLATORY SIGNALS

This invention relates to electronic circuitry useful in oscillatory mechanical analysis apparatus and particularly to a phase detecting circuit, a wave generator and a filter circuit.

BACKGROUND OF THE INVENTION

U.S. Pat. No. 3,589,167 (Hill), which issued to the assignee of the present invention, discloses a thermomechanical analysis apparatus. The apparatus includes a probe assembly which is suspended in nearly weightless contact with a sample material. Weightlessness is achieved by means of a fluid reservoir and a float which is submerged in the fluid and coupled to the probe. Weights are added manually to the probe assembly to just offset the buoyancy of the float. As the height of a sample under test changes, the nearly weightless probe moves up or down in response.

Vertical movement of the probe assembly of the Hill device is sensed by a conventional linear variable differential transformer (LVDT). The magnetic core of the LVDT is mounted on a non-magnetic rod which supports the probe. In this prior art device, a rack and pinion are provided for moving the LVDT coil assembly to achieve a null prior to beginning a measurement. The rod member which supports the probe passes through a pair of roller bearings. The entire assembly is suspended from a frame at a pair of spaced support points.

U.S. Pat. No. 4,354,764 (Ackermann et al) discloses a similar system in which electromagnetic means is utilized for compensation of the weight of the probe assembly. The electromagnetic means may be adjusted to apply a desired force to the sample, for example for hardness testing. It is further suggested in the Ackermann patent that a force may be applied in a cyclic fashion from which, e.g., the elasticity of the specimen can be determined.

The requirements for the electronic circuitry associated with dynamic oscillatory mechanical analysis apparatus are quite specialized. It is particularly desirable to measure the phase difference between the oscillatory force applied to a test sample (specimen) and the oscillatory dimensional response and, also, to measure changes in the magnitude or amplitude of the response. These determinations are to be effected over a period of time as the test sample is subjected to a varying temperature. Problems associated with the circuitry are related to the very low frequencies of interest, e.g. 0.01 to 100 hertz, and include low signal to noise ratio, drift, and sympathetic oscillations in the sample. There are potentially large and unpredictably variable changes in the DC component due to temperature induced changes in dimension and softness of the sample. There particularly is a need to process the low frequency signals for phase and amplitude independently of frequency, which conventional circuitry does not effect suitably.

Therefore an object of the present invention is to provide electronic circuitry suitable for generating and processing low frequency signals such as for oscillatory mechanical analysis apparatus. A more specific object is to measure phase of a signal relative to a reference signal independently of frequency and independently of a drifting DC component in the signal. A further object is to amplify and filter a low frequency weak signal independently of frequency. Another object is to provide a wave generator for generating a sine-type wave at relatively low cost and with a tunable wave form. Yet another object is to generate an oscillatory wave that has an operating frequency proportional to a control voltage and that may be utilized in a circuit for measuring phase independently of the operating frequency.

SUMMARY OF THE INVENTION

The aforementioned and other objectives are achieved according to one embodiment of the present invention by a phase detecting circuit for measuring a phase difference between two electrical oscillatory signals independently of frequency. The circuit comprises time signal means receptive of a first oscillatory electrical signal having a selected operating frequency and of a second oscillatory signal having the operating frequency, for producing successive time signals each representative of a phase time difference between the first and second oscillatory signals. It further comprises voltage means receptive of a supply voltage for providing a control voltage proportional to the operating frequency. Integrating means are receptive of the control voltage and each successive time signal for producing an output signal proportional to the control voltage and to each time signal such that the output signal is representative of the phase shift independently of the operating frequency.

In a preferred embodiment, the phase detecting circuit comprises phase detecting means receptive of a first oscillatory electrical signal having a selected operating frequency with a corresponding time cycle, for detecting a selected first phase point in the cycle and producing a first time signal corresponding to the first phase point, and for detecting a second phase point in the cycle one half cycle later than the first point. Time signal means are receptive of the first oscillatory electrical signal and of a second electrical signal formed as the sum of a time-varying DC level and a second oscillatory signal having the same operating frequency. The time signal means produce an initial time signal representative of the phase difference between the first and second oscillatory signals at the first phase point and a subsequent time signal representative of the phase difference between the first and second oscillatory signals at the second phase point. Averaging means average the initial time signal and the subsequent time signal for each cycle to produce an output signal, whereby the output signal represents the phase shift independently of the time-varying DC voltage.

The integrating means preferably comprises switching means having an input receptive of the control voltage and being responsive to the time signal for producing a switched output proportional to the control voltage during each successive time signal. An integrating capacitor is receptive of the switched output, and reset means empty the integrating capacitor between successive time signals, such that successive voltage levels are each effected successively on the integrating capacitor in proportion to each successive time signal and to the control voltage. Further to the integrating means, signal pulse means effect a signal pulse immediately after each time signal. Sample-hold means are receptive of each successive voltage level in response to the signal pulse for effecting a steady voltage output as the output signal, such that the voltage output is updated with each signal pulse.

In a further embodiment, wave generating means are responsive to the control voltage for generating the first oscillatory electrical signal. Preferably the wave generating means is a wave generator for generating a sine-type wave signal. In particular a triangular wave generating means is receptive of the control voltage for generating a triangular wave at the operating frequency. Squaring means then generates a squared wave, proportional to the square of the triangular wave, reversing means reverse polarity of alternate half cycles of the squared wave, and proportioning means effect a proportionate wave the magnitude of which is equal to a proportionality constant of approximately 0.5 times the square of the triangular wave. The proportionate wave has successive positive and negative half cycles. The triangular wave and the proportionate wave are combined such that each positive half cycle of the proportionate wave is added to a negative half cycle of the triangular wave and each negative half cycle of the proportionate wave added to a positive half cycle of the triangular wave, such as to generate a sine-type wave having a form substantially that of a sine wave. The proportionality constant may be varied such as to tune the form of the sine-type wave.

In yet a further embodiment, the phase detecting circuit comprises an electronic filter circuit for processing the second oscillatory electrical signal preparatory to measuring the phase difference. The filter circuit comprises a high pass filter with a first corner frequency and is receptive of the second oscillatory signal for producing an intermediate signal. A low pass filter means with a second corner frequency is receptive of the intermediate signal for producing an output signal having an output amplitude and a phase shift each relative to the input signal. The first corner frequency and the second corner frequency are each selected in proportion to the operating frequency whereby the output amplitude and the phase shift are each independent of the operating frequency. Preferably the first and second corner frequencies are each further selected to be approximately equal.

DETAILED DESCRIPTION OF THE INVENTION

Figure 1:
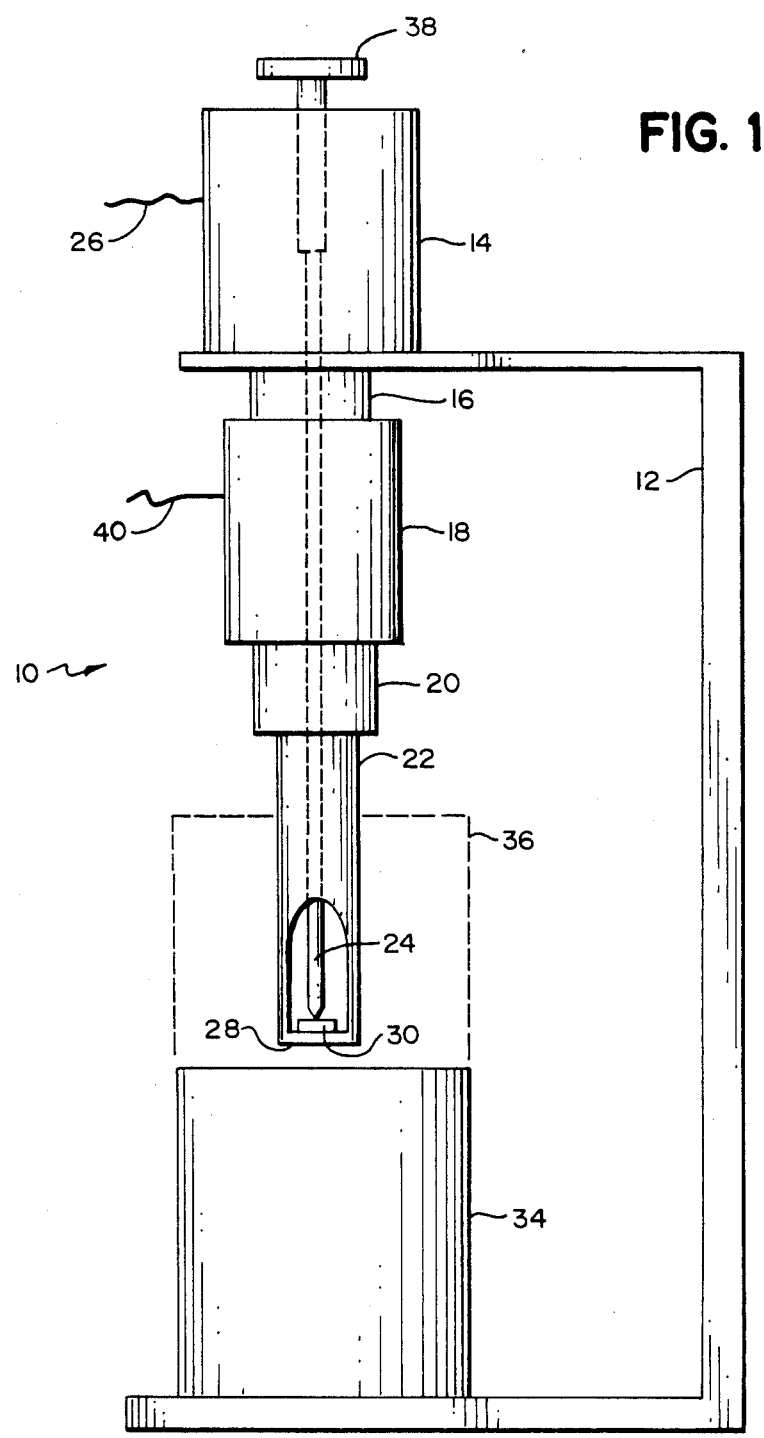
FIG. 1 is an elevated view of thermomechanical analysis apparatus useful in association with electrical circuitry of the present invention.

FIG. 1 shows a side view of a type of thermomechanical analysis apparatus 10 that may utilize circuitry according to the present invention. This apparatus is of the type disclosed in the U.S. patent application Ser. No. 704,353 filed Feb. 21, 1985 and assigned to the same assignee as the present invention. The components, except for a stand 12, are generally cylindrical and coaxial. A linear motor 14 is mounted on the stand and has connected below it, in tandem, an upper chamber 16, a transducer 18, a lower chamber 20 and a furnace tube 22. A floating probe 24 extending axially through apparatus 10 is supported mainly by linear motor 14 with electrical current supplied thereto on line 26. On top of probe 24 is a tray 25 on which weights (not shown) may be placed for calibration purposes. The lifting force of the motor is directly proportional to the current.

The bottom of furnace tube 22 forms a platform 28 for a test sample 30 that may be placed into the tube through an opening therein. A furnace 34, shown in a lowered position, may be raised to an upper position 36 (dashed lines in FIG. 1) surrounding the furnace tube and sample. The furnace is electrically heated and also may be cooled by liquid nitrogen to provide an operating range of $-180°$ C. to $1000°$ C.

In one mode apparatus 10 is operated with a current to linear motor 14 adjusted to uncompensate for the weight of the probe system to allow a remaining very small downward force of probe 24 on sample 30. An increasing temperature causes thermal expansion of the sample and raising of probe 24 which is detected by transducer 18. The latter is a conventional linear variable differential transformer, and provides a voltage output on line 40 indicating linear position of the probe, representing changes in sample thickness.

In a second mode, which is that utilizing the present invention, an additional oscillating current is superimposed as a sine wave to the linear motor as a force signal so as to additionally apply an oscillating force to the sample. The sample thickness dimension then oscillates in response with a position signal wave pattern such as a change in phase that is detected by the transducer. This wave typically will have a phase lag relative to the force oscillation. The average sample thickness may change during heating of the sample because of thermal expansion and softness that may develop under the applied force. Therefore the transducer may output a wave pattern comprising a sine-type wave superimposed on a (approximately) linearly changing DC voltage. A force signal and position signal (with a decreasing DC component) may be seen in FIG. 3.

Figure 2:
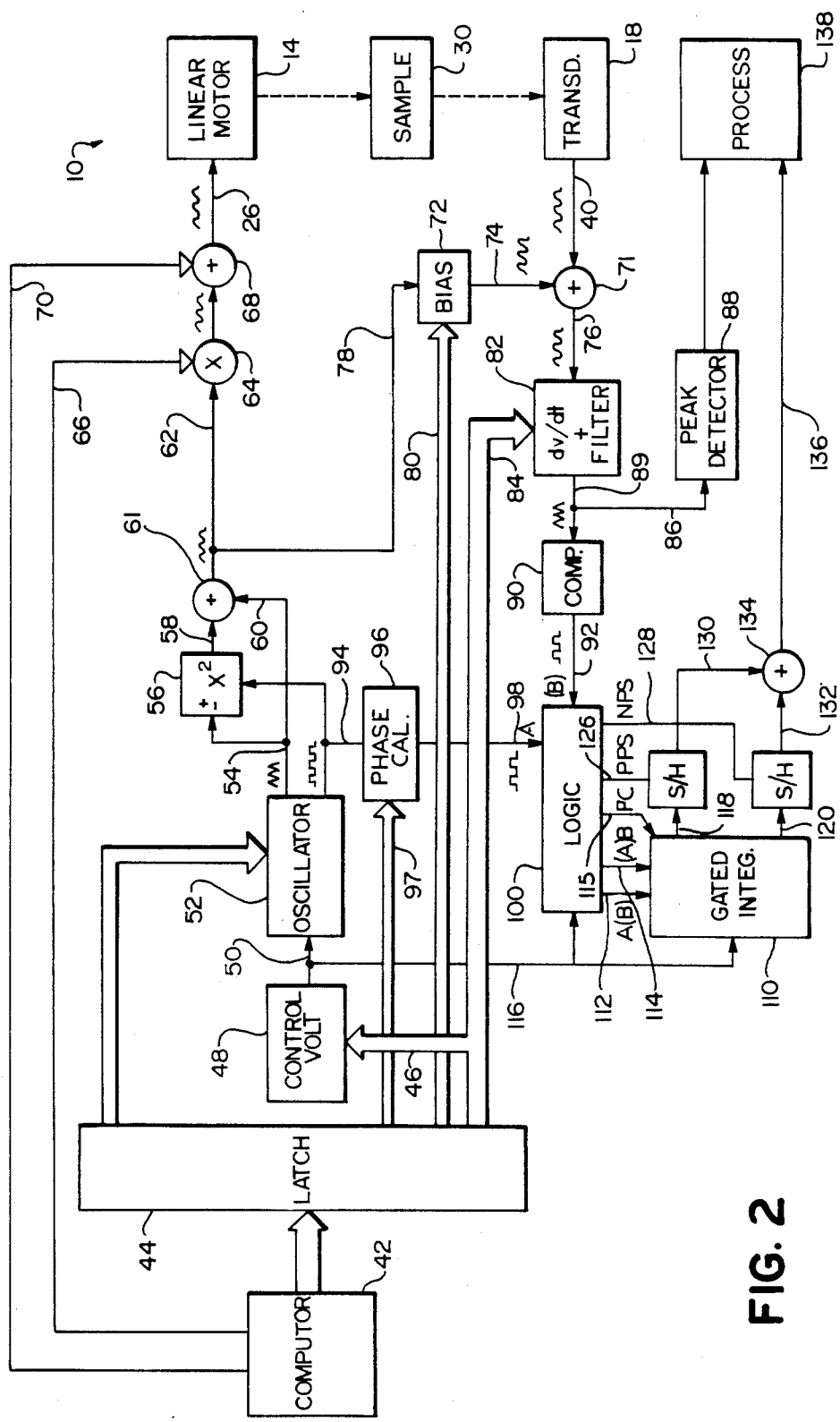
FIG. 2 is a block diagram of electrical circuitry according to the present invention including, in combination with associated circuitry, an oscillator, a differentiating filter, a logic component and a phase detector.

FIG. 2 is a block diagram of overall circuitry utilized to drive linear motor 14 of apparatus 10 and to process the signal generated from the dimensional changes in sample 30 by transducer 18. The circuitry is a combination of analog and logic, and measures changes in the phase and amplitude of the transducer signal relative to the force signal.

Following the block diagram from the left, digital control messages from computor 42 are fed to digital latch circuit 44 for distribution. Messages on frequency selection path 46 select a DC control voltage output from a conventional DC voltage source 48. The control voltage on line 50 is received by oscillator 52 which generates a triangular wave having a frequency proportional (i.e. in linear relationship) to the control voltage. The oscillator also provides on line 94 a square wave of the same frequency in a selected phase relationship with the triangular wave.

The triangular wave signal on line 54 is tapped off to multiplier 56 which squares the wave, reverses polarity of alternate cycles and generates a resulting wave on line 58 having an amplitude approximately half that of triangular wave. The reversing squared wave on line 58 and the triangular wave on line 60 are combined in a summing circuit 61 to generate a first oscillatory electrical signal in the form of a sine-type wave on line 62.

A conventional analog multiplier 64 has a gain selected by an analog input signal on line 66 from computer 42. A further summing circuit 68 adds a DC current which is selected via line 70, and the resulting current signal is directed on line 26 to linear motor 14 which applies a corresponding force to sample 30. Optionally, the DC current from source 70 also is provided for the linear motor to impose at least enough steady force component on the sample to compensate for the oscillation so that a force is applied at all times through the cycle; additional force may be desired.

The oscillating dimensional response of sample 30 is detected by transducer 18 which produces a second oscillatory signal which is a generally sinusoidal type of position signal, possibly having a drifting linear component, on line 40. Conventional mixer 71 is provided to optionally add a small oscillatory bias from line 74 to effect a combined signal outputed on line 76, which may be necessary when the true, position signal is very small to keep subsequent circuitry alive. This bias via circuit 72 utilizes the original sine wave tapped from line 62 via line 78 and the bias level is selected digitally via line 80.

The biased signal is directed to a differentiating filter circuit 82 to remove any DC component, filter out noise and amplify the signal (which is quite small). Circuit 82 is receptive of a frequency selection message on line 84 to allow processing of signal gain and phase independently of frequency, as described below. A portion of the processed signal, in a form which is substantially a triangular wave, is tapped off via line 86 to a peak detector circuit 88 for amplitude measurement. Otherwise the processed signal is directed on line 89 to a comparator 90 which produces a second wave form in the form of a second square wave on line 92 that is referenced below as type "(B)".

A first wave form in the form of first square wave on line 94 from oscillator 52 is fed to a phase calibrator 96 responsive to digital messages on line 97 for producing a square wave "A" for comparison to measure the phase changes of the transducer signal relative to the force signal. Wave "A" is in a fixed phase relationship with the force sine wave, for example 20° lead. The two square waves A and (B), which represent respective first and second oscillatory signals to be compared, such signals being, for example, the respective sine waves on line 26 and line 40 are directed respectively on lines 98, 92 to a logic circuit 100 for mixing. Relative phases are calibrated so that a square wave "B", which is an inverted wave (B) as described below, lags wave A by about 20°, without sample effects. Further lag due to the sample characteristics are then measured from this basis.

Figure 3:
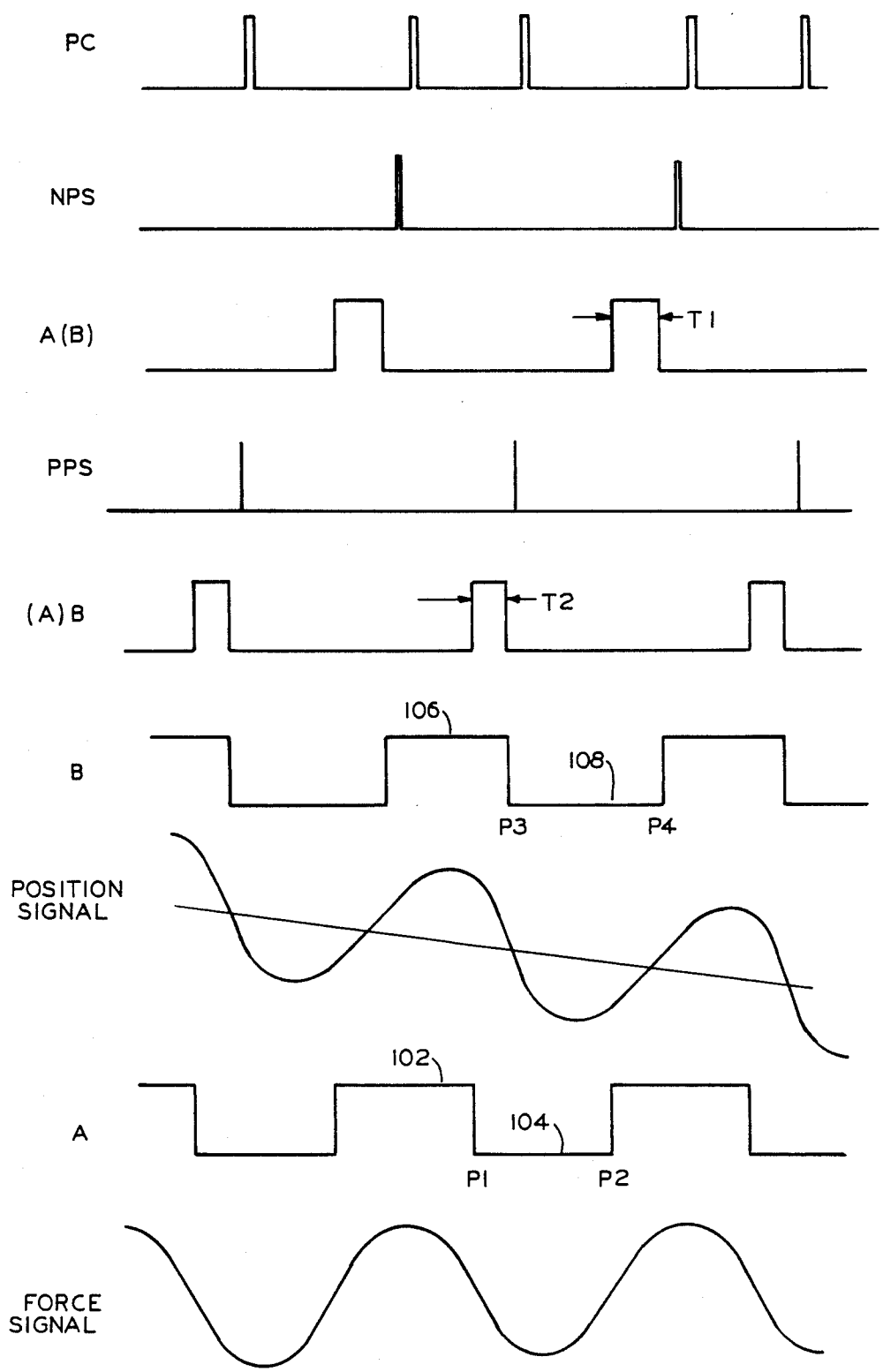
FIG. 3 is a set of graphs of various signals and their phase relationships generated in the circuitry of FIG. 2, including a force signal, a position signal and associated square waves and pulses.

Relevant wave forms are shown in FIG. 3. For clarity square wave A is shown in phase with the force signal wave. Square wave A may be defined by a first upper voltage 102 and a first lower voltage 104 (e.g. zero), and wave B, corresponding to a position signal similarly may be defined by a second upper voltage 106 and a second lower voltage 108. These upper and lower voltages for wave A are delineated at successive points of time P1, P2 during the cycle. Wave A will have half cycle phase point delineations. The phase time delineations P3, P4 of wave B will generally lag those of wave A. A time signal means comprised of circuit 100 (FIG. 2) effects during each cycle a single first pulse A(B) having a first time interval T1 coinciding the first upper voltage 102 and the second lower voltage 108. It further effects a single second pulse (A)B having a second time interval T2 coinciding the second upper voltage 106 and the first lower voltage 104. Thus, the first pulses are formed as A(B) meaning "A, not B", and the second pulses as (A)B meaning "B, not A". Signals A(B) and (A)B are successive time signals each generally proportional to or, more broadly representative of a phase difference between the first and second oscillatory signals.

Additional short signal pulses are generated in the logic circuit for subsequent control purposes and are relative to A(B) and (A)B as shown in FIG. 3. A first signal pulse PPS immediately follows (A)B but precedes the next A(B). A second signal pulse NPS immediately follows A(B) but precedes the next (A)B. A third set of signal pulses PC immediately follow each of PPS and NPS.

Returning to block diagram FIG. 2, a gated integrator 110 is receptive of pulses A(B) and (A)B on lines 112, 114 respectively. The integrator is further receptive of the same control voltage, on line 116, that drives oscillator 52. As described in detail below, successive first and second voltage level pulses are effected by integrator 110 alternately on lines 118, 120. These levels are proportional (i.e. in direct linear relationship) to the time intervals T1, T2 of pulses A(B) and (A)B respectively, and also are proportional to the control voltage and, therefore, to the operating frequency.

Figure 4:
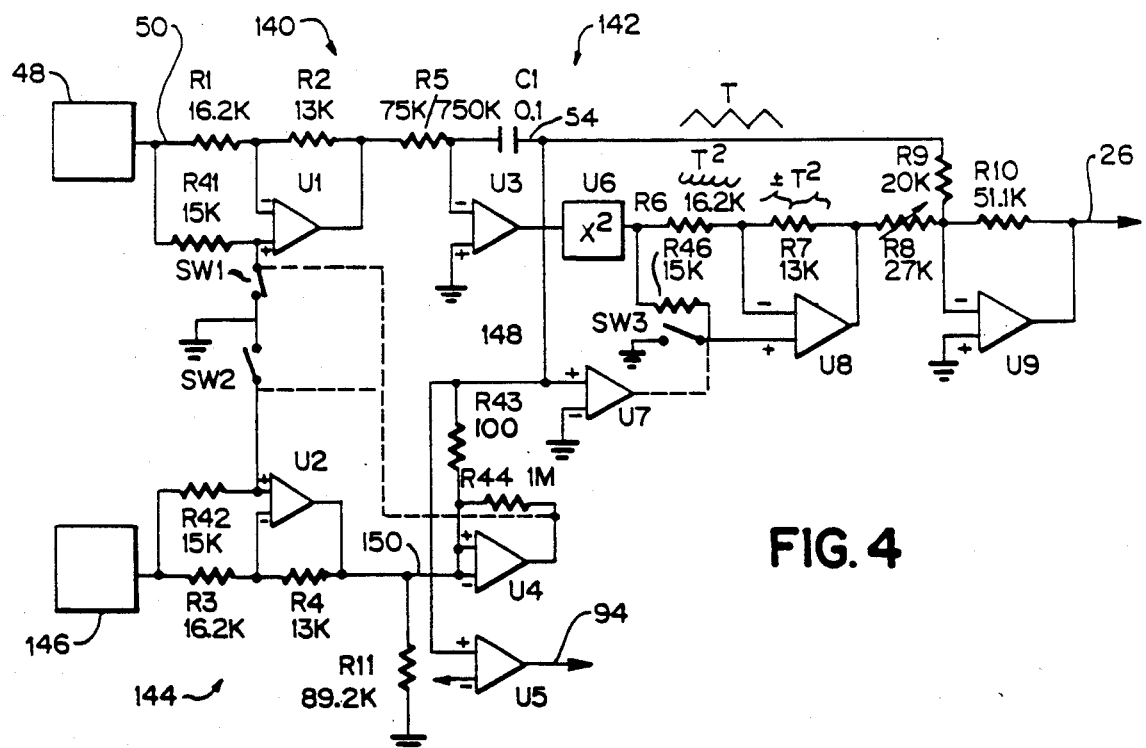
FIG. 4 is a circuit diagram of an oscillator portion of FIG. 2.
Figure 8:
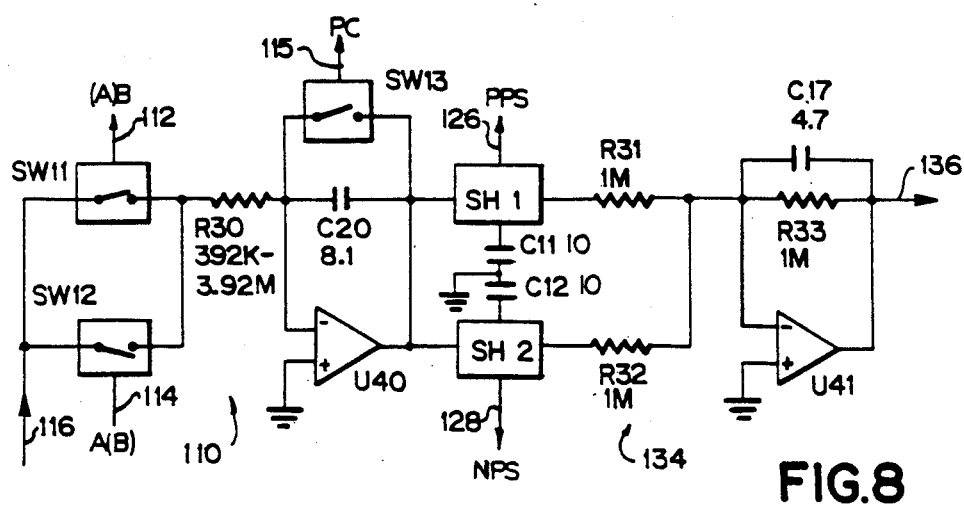
FIG. 8 is a circuit diagram of a phase detecting portion of FIG. 2.
Figure 6:
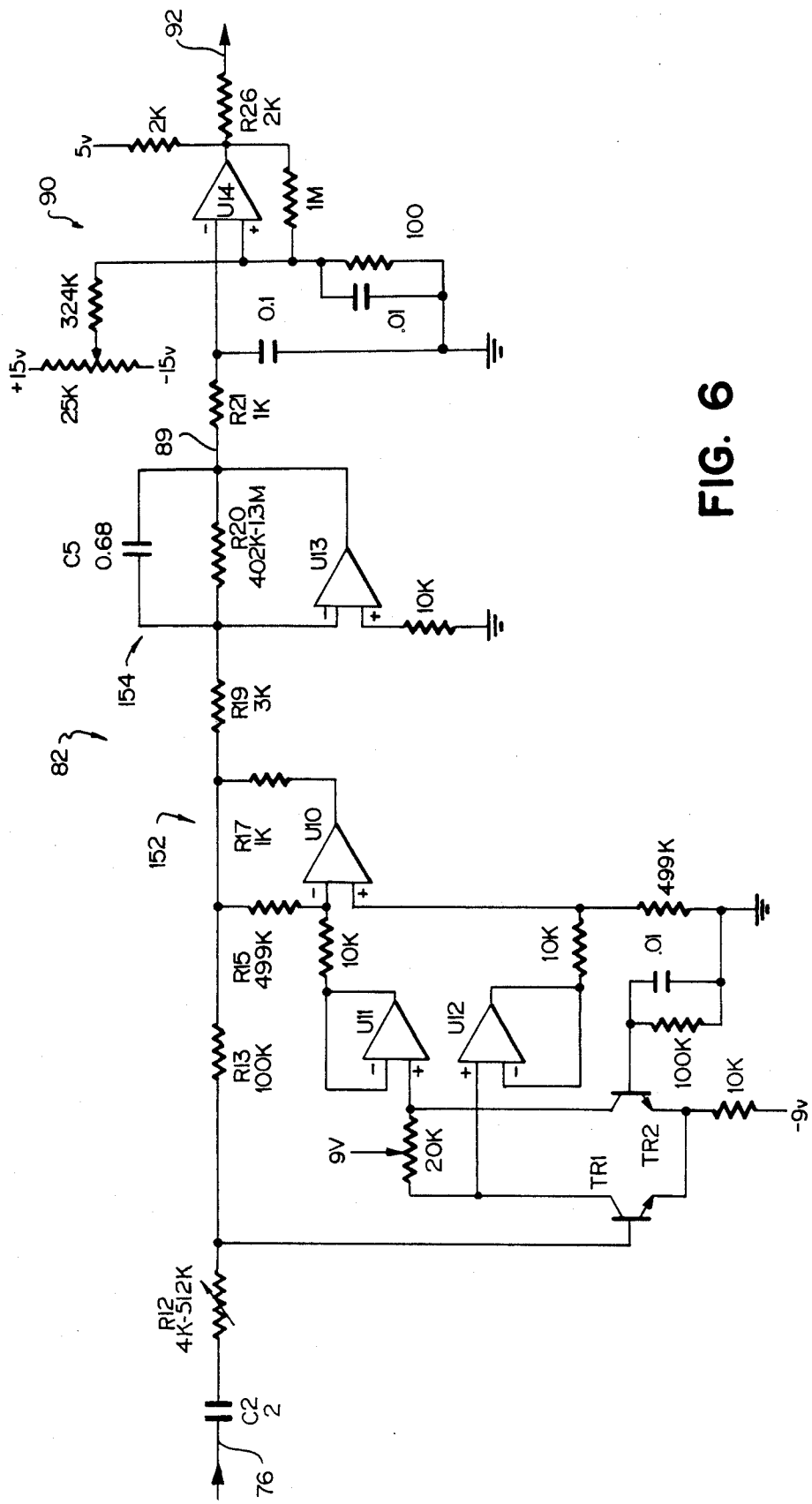
FIG. 6 is a circuit digram of a differentiating filter component of FIG. 2.
Figure 7:
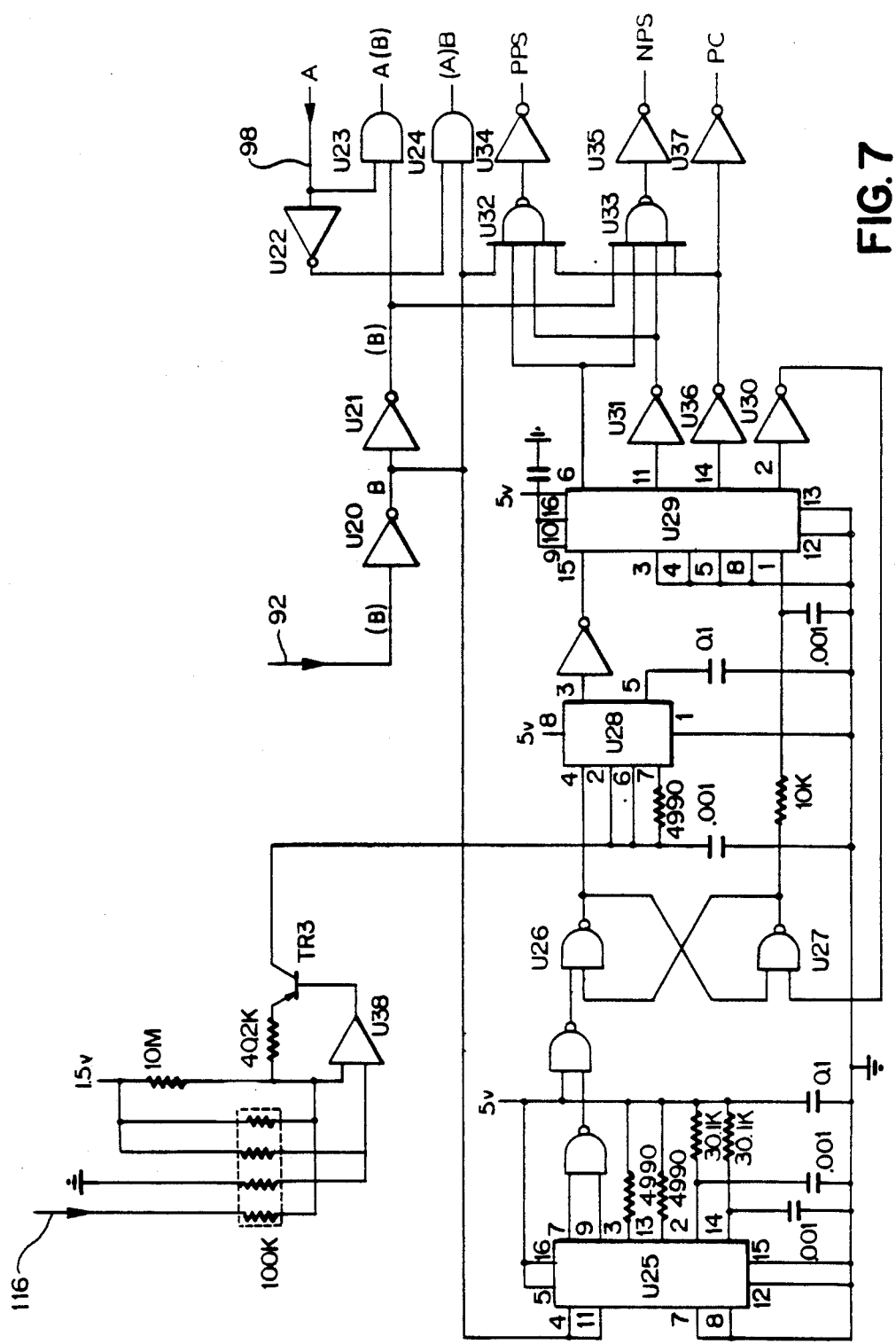
FIG. 7 is a circuit diagram of a logic component of FIG. 2.

The voltage level pulses are received respectively by first and second sample-hold circuits SH1, SH2 at appropriate points of time in a cycle as triggered by signals PPS and NPS on lines 126, 128 respectively. The sample-holds each output steady first and second voltages on lines 130, 132. These voltages are updated each cycle by the sample-holds, and are averaged in a summing circuit 134 to effect a steady output signal on line 136 updated each half cycle to represent the phase shift. A processor 138 suitably stores, displays and/or prints the information from the phase detector as well as peak detector 88. FIGS. 4 and 6-8 are diagrams of some of the specific circuitry shown in block diagram form in FIG. 2. FIG. 4 is a circuit for oscillator 52. FIG. 6 shows a circuit for differentiating filter 82. FIG. 7 illustrates a logic circuit 100. FIG. 8 is a circuit including gated integrator 110, sample/hold devices SH1, SH2 and summing amplifier 134. For clarity, conventional circuitry such as power supply voltages and capacitors and the like, normally associated with operational amplifiers, are generally omitted; it will be appreciated that one skilled in the art will readily be able to include those elements.

FIG. 4 shows an oscillator circuit 52 for generating a sine-type wave according to an embodiment of the present invention. A switchable first inverter 140 comprises an operational amplifier (op-amp) U1 with an inverting input, resistor R41 across inputs, and a feed back resistor R2. The noninverting input is selectively grounded through an analog switch SW1. The inverting input is receptive of the frequency control voltage of up to 8v on line 50 from source 48 through resistor R1. The output effects an upper level voltage proportional to the control voltage, or a lower (e.g. negative the upper level) level voltage as determined by the position of switch SW1. This output is processed by an integrating circuit 142 comprising a feedback capacitor C1 on the inverting input of an op-amp U3, effecting a linearly ramping voltage, ramping positively or negatively depending on the position of switch SW1.

A similar switchable second inverter 144, comprising second op-amp U2 with resistors R3, R4, R42 and a second analog switch SW2, receives a fixed reference voltage of about 10v from a fixed reference source 146. The reference output polarity is at an upper or lower (e.g. +/−) voltage as determined by the second switch position established oppositely phased with that of the first switch SW1. In a feedback loop on line 148, op-amp comparator U4 compares the ramping voltage on line 148 with the reference output from inverter 114 on line 150 to effect alternating first and second switching signals to analog switches SW1, SW2.

Thus the ramping voltage increases linearly with time at a rate proportional to the control voltage until it is slightly greater than the reference output. At this time comparator U4 changes state and the voltages from the inverters U1, U2 change sign. The ramping voltage then decreases linearly at the same rate until it is slightly less than the (negative) value of the reference, when the polarities are again reversed, and the process repeats itself cyclically. Resistors R43, R44 on comparator U4 provide hysteresis at comparator U4 to ensure reliable switching. The result is a triangular wave T of about 20v p—p on line 54 having a frequency proportional to the control voltage which is adjustable to select the operating frequency. Resistor R5, inputting integrator U3, may be selected from two or more resistances by messages to accompanying analog switches (not shown) to select and optimize broad frequency ranges of operation of the oscillator. A conventional analog multiplier U6 squares the triangular wave T to generate a squared wave $T^2$. This wave is inputed through resistors R6, R46 to a third inverter U8 with a feedback resistor R7 and an analog switch SW3 similar to the first two. An op-amp U7 comparator similarly receptive of the ramping voltage in the loop on line 148 operates switch SW3 to reverse the polarity of the squared wave every half cycle to effect a proportionate wave defined as the squared wave having successive positive and negative half cycles, being negative when the triangular wave is positive, and positive when the triangular wave is negative. A conventional summing circuit inputting an op-amp U9 with feedback resistor R10 combines the triangular wave and the proportionate wave.

Figure 5:
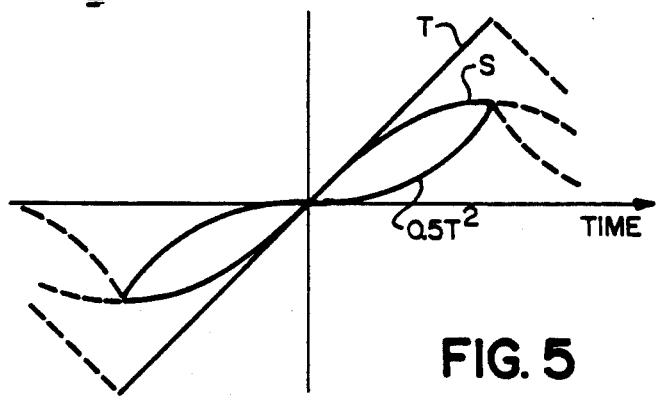
FIG. 5 is a graph of waveforms generated in the circuitry of FIG. 4.

Waveforms are shown in FIG. 5. Resistors R8, R9 (Fig. 4) in the circuit cooperatively provide that the squared wave be equal to a +/− proportionality constant times the square of the triangular wave T. When the constant is equal to 0.5 the combined wave T +/−0.5 $T^2$ is substantially a sine wave S. Trimpot resistor R8 may be adjusted to vary the constant, for example to make the third harmonic zero. Generally the proportionality constant should be between about 0.4 and 0.6. The sine-type wave (amplified and with a DC component added as explained for FIG. 2) is then sent to linear motor 14.

Still referring to FIG. 4, an additional op-amp comparator U5 is placed on loop 148 for comparing the ramping voltage with the reversing reference on line 150. This produces a square wave which is used as the wave A in the phase measurement, as explained above and in more detail below. Adjustment of reference phase of wave A relative to the force wave is provided through resistance R11 which may conventionally comprise two or more resistors with analog switches (not shown).

An active filter circuit 82 (FIG. 2) is illustrated in FIG. 6. A high pass filter 152 includes a differential transistor pair TR1, TR2 followed by an instrumentation amplifier comprising three operational amplifiers U10, U11, U12 with associated resistors including feedback resistor R13. Differentiating capacitor C2 is at the input where the signal from the transducer is received on line 76. A selectable first input resistor R12 is inserted between the capacitor and the input terminal to the first transistor TR1. An output resistor R17 from op-amp U10 also connects back to resistor R13.

A low pass filter 15 receives the intermediate signal from high pass filter 152 and includes a further op-amp U13 connected to the first filter output via an input resistor R19. A feedback capacitor C5 and a second selectable feedback resistor R20 are connected back to the inverting input.

Ordinarily the output of a filter circuit varies with frequency of the signal being processed. However, according to the present invention, the respective first and second corner frequencies of the two filter components are selected in proportion to the operating frequency. It has been determined that, with such proportionality, the filter circuit may be adjusted to process the input signal into an output signal with a phase and an amplitude each made independent of the operating frequency.

Selection of the corner frequencies is effected by selection of the corner frequency-determining components of the high and low pass filters. In the case of FIG. 6 these are the two selectable resistors; resistor R12 controls the first corner frequency for the high pass filter, and resistor R20 controls the second corner frequency for the low pass filter. These resistances may merely be variable resistors. Preferably for the present utilization, these each are a conventional organized bank of resistors (e.g. 8 in number) and associated analog switches (not shown, for clarity) controlled by logic messages from the computor, preferably the same messages that determine the control voltage on which the operating frequency depends.

Preferably the corner frequencies are chosen to be approximately equal to each other so that filter circuit 82 acts as a very narrow band-pass filter to remove any DC level and noise and provide amplification of a weak input signal. The operating frequency should be within 10% of the peak gain frequency of the filter. The present example provides a gain of about 33.

Continuing with FIG. 6, the signal from filter 82 on line 89 goes through a resistor R21 to the inverting input of a comparator 90 op-amp U14 converting the filter output to square wave (B). The output is fed through resistor R26 and line 92 to logic circuit 100 (FIG. 2).

FIG. 7 shows a suitable logic circuit 100 which is of the conventional type. Wave A is received from line 98 and inverted wave (B) is from line 92. These are appropriately inverted by logic invertors U20-U22 to form waves (A) and B which are mixed with the original wave forms with AND gates U23, U24 to form the A(B) and (A)B pulses.

The remainder of circuit 100 generates the pulse signals. The B and (B) square wave timing signals are applied to a dual monostable multivibrator which generates a 30 microsecond pulse at each transition of B. These pulses are inverted and used to trigger R-S flip-flop NAND gates U26, U27. When the flip-flop turns on, timer U28 generates 8 line pulses per half cycle which are counted by U29. The function of the counter is to generate control pulses PPS and NPS through logic devices U31-U35. After each sampling pulse, a wider pulse PC is generated through U36, U37. After the PC pulse, at the count of 8, the flip-flop is reset through inverter U30.

At 51.0 Hz, the time interval from crossover to the end of the PC pulse is approximately 3 ms; as the operating frequency decreases, this interval increases, reaching 125 ms at 0.2 Hz. This function is provided by a 100K resistor array, an op-amp U38 and transistor TR3 which is connected as a current source, with an output current proportional to the oscillator control voltage. The extra 10M resistor biases the output current by 2 microamperes to reduce the dynamic range. This is done to preclude spurious triggering of the sampling circuit by noise on the differentiated LVDT signal near the crossover point.

A phase detecting circuit for carrying out the present invention is shown in FIG. 8 and includes gated integrator 110. A first analog switch SW11, and a second analog switch SW12 are connected in parallel with a common input and a common output. The common input is receptive of the control voltage from line 116. An intermediate resistor R30 is connected to the common output. For operation over wide frequency ranges this resistor may be selected from with a circuit (not shown, for clarity) consisting of two (or more) resistors and associated analog switches. An integrating circuit comprising an op-amp U40 with an integrating feedback capacitor C20 is connected to intermediate resistor R30. An analog reset switch SW13 is placed across capacitor C20.

First sample-hold module SH1 and second sample-hold module SH2 have a common input from the integrating circuit. A first holding capacitor C11 is cooperatively associated with the first module SH1 and a second holding capacitor C12 is cooperatively associated with the second module SH2.

The outputs of the sample-hold modules are passed respectively through resistors R31, R32 to the inverting output of a summing amplifier comprising an op-amp U41 with a feedback capacitor C17 and a parallel resistor R33.

The signals depicted in FIG. 3 and generated by logic circuit 100 are applied to the phase circuit as indicated in FIG. 8. The (A)B signal is sent on line 112 to the first switch SW11 and the A(B) signal is sent on line 114 to the second switch SW12. The PC reset signal is sent via line 115 to the reset switch SW13. The PPS signal pulse is sent on line 126 to the first sample-hold SH1 and the NPS signal pulse is sent on line 128 to the second sample-hold SH2.

Reference is also made to FIG. 3 for signal timing during a cycle. Switch SW11 is closed by signal (A)B and capacitor C20 is ramped linearly to a first voltage level that is proportional to the first time interval of the (A)B pulse width and also is proportional to the control voltage on line 116. Immediately thereafter pulse PPS causes sample-hold SH1 to hold the first voltage level on capacitor C20 as a first voltage output. Then capacitor C20 is emptied by pulse PC to switch SW13 in readiness for the next half cycle that is initiated by signal A(B) to switch SW12.

The same sequence then generates a second voltage level on capacitor C20 proportional to the second time interval of A(B) and to the control voltage. Cooperatively with pulse NPS on line 128 from circuit 100 (FIG. 2) a second voltage output is held on capacitor C12 of sample-hold SH2. The two output voltages through resistors R31, R32 respectively are summed continuously and are updated every half cycle as a new voltage arrives.

The output signal thus represents an average of the phase shifts of the oscillatory transducer output signal relative to the oscillatory force input signal to the linear motor, for each half cycle. Any drift reflected as a time varying DC voltage on the oscillatory output signal, which would normally cause an error in a phase measurement, is averaged out by the phase detecting circuitry of FIG. 8.

Furthermore, the output signal from the phase detecting circuit is independent of the operating frequency. This follows from the fact that the control voltage is proportional to the frequency, i.e. inversely proportional to the cycle time period. Since a voltage level on capacitor C10 is proportional to a pulse time interval and inversely proportional to the cycle time period, frequency dependence vanishes and the voltage level represents only a phase change.

It now may be appreciated that the herein method and apparatus for generating the sine-type wave is highly convenient and useful for effecting frequency independence with the herein phase detecting circuit. In particular, the precursor triangular wave, and therefore the sine wave, is readily generated with a frequency proportional to the control voltage. The same control voltage is then utilized for the phase detecting circuit.

The circuitry of the present invention is especially suited for generating processing and analyzing signals associated with dynamic thermomechanical analysis such as illustrated in FIG. 1, or for other such apparatus or electronic purposes. In particular, it is suited for processing low to very low frequency signals, for example below 50 hertz down to about 0.01 hertz.

While the invention has been described above in detail with reference to specific embodiments, various changes and modifications which fall within the spirit of the invention and scope of the appended claims will become apparent to those skilled in this art. The invention is therefore only intended to be limited by the appended claims or their equivalents.

What is claimed is:

1. A phase detecting circuit for measuring a phase difference between two oscillatory signals independently of frequency, comprising:
   first wave form means associated with a first oscillatory signal having a selected operating frequency for producing a corresponding first square wave form;
   second wave form means associated with a second oscillatory signal having the selected operating frequency and a phase difference from the first oscillatory signal for producing a corresponding second square wave form;
   time signal means receptive of the first square wave and the second square wave form for producing successively at least one time signal per cycle of the first square wave form, each such signal being representative of a time difference corresponding to the phase difference;

voltage means for providing a control voltage proportional to the selected operating frequency; and integrating means receptive of the control voltage and each successive time signal for producing an output signal proportional to the control voltage and proportional to each time signal successively such as to produce the output signal as representative of the phase difference independently of the selected operating frequency.

2. A phase detecting circuit according to claim 1 wherein the integrating means comprises switching means having an input receptive of the control voltage and being responsive to the time signal for producing a switched output proportional to the control voltage during each successive time signal, an integrating capacitor receptive of the switched output, and reset means for emptying the integrating capacitor between successive time signals, such that successive voltage levels are each effected successively on the integrating capacitor in proportion to each successive time signal and to the control voltage.

3. A phase detecting circuit according to claim 2 wherein the time signal means further produces a signal pulse immediately after each time signal, and the phase detecting circuit further comprises sample-hold means receptive of each successive voltage level in response to the signal pulse for effecting a steady voltage output as the output signal, such that the voltage output is updated with each signal pulse.

4. A phase detecting circuit according to claim 1 further comprising oscillator means responsive to the control voltage for generating the first oscillatory signal wherein the control voltage is proportional to the selected operating frequency.

5. A phase detecting circuit according to claim 4 wherein the oscillator means is a wave generator for generating an electrical sine-type wave signal, comprising triangular wave generating means receptive of the control voltage for generating an electrical signal formed of a triangular wave having the operating frequency, squaring means for generating a squared wave proportional to the square of the triangular wave, reversing means for reversing polarity of alternate half cycles of the squared wave, proportioning means for effecting a proportionate wave the magnitude of which is equal to a proportionality constant of approximately 0.5 times the square of the triangular wave, the proportionate wave having successive positive and negative half cycles, and combination means for combining the triangular wave and the proportionate wave such that each positive half cycle of the proportionate wave is added to a negative half cycle of the triangular wave and each negative half cycle of the proportionate wave is added to a positive half cycle of the triangular wave, such as to generate a sine-type wave having a form substantially that of a sine wave.

6. A phase detecting circuit according to claim 5 wherein the wave generator further comprises tuning means for varying the proportionality constant such as to tune the form of the sine-type wave.

7. A phase detecting circuit according to claim 5 wherein the triangular wave generating means comprises a switchable first inverter receptive of the control voltage for producing alternately a lower level voltage and an upper level voltage relative to the lower level voltage in proportion to the control voltage, a switchable second inverter receptive of a reference voltage for producing alternately a lower reference voltage and an upper reference voltage relative to the lower reference voltage, an integrating circuit alternately receptive of the upper level voltage for generating a positively ramping voltage and of the lower level voltage for generating a negatively ramping voltage, whereby the alternating ramping voltages constitute the triangular wave, and a comparator receptive of the positively ramping voltage and the upper reference voltage for producing a first switching signal when the positively ramping voltage reaches a first predetermined switching level, and alternatively receptive of the negatively ramping voltage and the lower reference voltage for producing a second switching signal when the negatively ramping voltage reaches a second predetermined switching level, the first inverter including a first switching means alternately responsive to the first and the second switching signals for producing alternatively the upper and the lower level voltages, and the second inverter including a second switching means alternately responsive to the first and the second switching signals for producing alternatively the upper and the lower reference voltages.

8. A phase detecting circuit according to claim 1 further comprising an electronic filter circuit for processing the second oscillatory signal preparatory to measuring the phase difference, wherein the filter circuit comprises a high pass filter with a first corner frequency and being receptive of the second oscillatory signal for producing an intermediate signal, low pass filter means with a second corner frequency and being receptive of the intermediate signal for producing an output signal having an output amplitude and a phase shift each relative to the second oscillatory signal, and tuning means for selecting the first corner frequency and the second corner frequency each in proportion to the operating frequency whereby the output amplitude and the phase shift are each independent of the operating frequency.

9. A phase detecting circuit according to claim 8 wherein the first and second corner frequencies are each further selected to be approximately equal.

10. A phase detecting circuit according to claim 8 wherein the high pass filter comprises a first active filter including a differentiating capacitor and a corner frequency-determining input resistor connected to the differentiating capacitor, the input resistor having a selectable resistance in inverse proportion to the operating frequency, and the low pass filter means comprises a second active filter including a corner-frequency-determining feedback resistor having a selectable resistance in inverse proportion to the operating frequency.

11. A phase detecting circuit according to claim 10 wherein the first active filter further includes a differential transistor pair followed by an instrumentation amplifier, the transistor pair having a first input terminal with the input resistor being connected between the differentiating capacitor and the first input terminal, and the second active filter further includes an operational amplifier with an inverting second input terminal with the frequency-determining resistor being connected to the second input terminal.

12. A phase detecting circuit for detecting the average phase difference between two oscillatory signals, comprising:

a first square wave generator cooperative with a first oscillatory signal having a selected operating frequency with corresponding time cycles, for generating a first square wave in a fixed first phase relationship with the first oscillatory signal, the first square wave being defined by a first upper voltage and a first lower voltage;

a second square wave generator cooperative with a second electrical signal formed as the sum of a time-varying DC level and a second oscillatory signal having the same operating frequency, for generating a second square wave in a fixed second phase relationship with the second oscillatory signal, the second square wave being defined by a second upper voltage and a second lower voltage;

mixing means for mixing the first and second square waves to effect during each cycle a single first pulse having a first time interval coinciding the first upper voltage and the second lower voltage, and a single second pulse having a second time interval coinciding the second upper voltage and the first lower voltage;

voltage means for generating a control voltage proportional to the operating frequency; integrating means receptive of the control voltage and the first pulse for producing a first output voltage proportional to the control voltage and to the first time interval, the integrating means being further receptive of the second pulse for producing a second output voltage proportional to the control voltage and to the second time interval;

summing means for combining the first and second output voltages to produce an output signal representing the phase shift independently of the time varying DC voltage and the operating frequency.

13. A phase detecting circuit according to claim 12 wherein the integrating means comprises a first switch and a second switch connected in parallel and having a common input receptive of the control voltage and further having a common output with the first switch being responsive to the first pulse and the second switch being responsive to the second pulse, an integrating capacitor receptive of the common output, and reset means for emptying the integrating capacitor between each successive first and second pulses, such that the first and second output voltage levels are effected alternately on the integrating capacitor in proportion respectively to the first and second time intervals and in proportion to the control voltage.

14. A phase detecting circuit according to claim 13 further comprising signal means for effecting a first signal pulse immediately after the first pulse and effecting a second signal pulse immediately after the second pulse, and wherein the summing means comprises a first holding capacitor and a first sample-hold module cooperatively associated therewith receptive of the first voltage level in response to the first signal pulse to effect a first voltage output representing the first voltage level, a second holding capacitor and a second sample-hold module cooperatively associated therewith receptive of the second voltage level in response to the second signal pulse to effect a second voltage output representing the second voltage level, and a summing circuit to sum the first and second voltage outputs to effect the output signal.

15. A phase detecting circuit for measuring a phase difference between two wave forms independently of frequency, comprising time signal means receptive of a first wave form having a selected operating frequency and of a second wave form having the selected operating frequency with the second wave form further having a phase difference from the first wave form for producing successively at least one time signal per cycle of the first wave form with each such signal being representative of a time difference corresponding to the phase difference, voltage means for providing a control voltage proportional to the selected operating frequency, and integrating means are receptive of the control voltage and each successive time signal for producing an output signal proportional to the control voltage and proportional to each time signal successively such as to produce the output signal is representative of the phase difference independently of the selected operating frequency.

16. A phase detecting circuit according to claim 15 wherein the integrating means comprises switching means having an input receptive of the control voltage and being responsive to the time signal for producing a switched output proportional to the control voltage during each successive time signal, an integrating capacitor receptive of the switched output, and reset means for emptying the integrating capacitor between successive time signals, such that successive voltage levels are each effected successively on the integrating capacitor in proportion to each successive time signal and to the control voltage.

17. A phase detecting circuit according to claim 16 wherein the time signal means further produces a signal pulse immediately after each time signal, and the phase detecting circuit further comprises sample-hold means receptive of each successive voltage level in response to the signal pulse for effecting a steady voltage output as the output signal, such that the voltage output is updated with each signal pulse.

18. A phase detecting circuit according to claim 4 wherein the first wave form means comprises oscillator means.

19. A phase detecting circuit for measuring a phase difference between two oscillatory signals, comprising:

time signal means receptive of a first wave form corresponding to a first oscillatory signal having a selected operating frequency with a corresponding time cycle, and of a second wave form corresponding to a second oscillatory signal formed as the sum of a time-varying DC level and a further oscillatory signal having the selected operating frequency, the second oscillatory signal having an average phase difference from the first oscillatory signal, the time signal means producing an initial time signal representative of a phase difference between first and second oscillatory signals at a selected phase point in the time cycle and further producing a subsequent time signal representative of the phase difference between the first and second oscillatory signals at a subsequent phase point in the time cycle one half cycle later than the selected phase point;

voltage means for providing a control voltage proportional to the selected operating frequency;

integrating means receptive of the control voltage and adapted for processing the initial time signal and the subsequent time signal respectively into a first output voltage and a second output voltage, the first and second output voltages each being proportional to the control voltage and further being proportional respectively to the initial time signal and the subsequent time signal; and summing means for combining the first and second output voltages to produce an output signal is representing the average phase difference independently of the time varying DC voltage and the operating frequency.

20. A phase detecting circuit for measuring a phase difference between two oscillatory signals, comprising:

wave means for generating a second wave form corresponding to a second oscillatory signal formed as the sum of a time-varying DC level and a further oscillatory signal having a selected operating frequency with a corresponding time cycle;

time signal means receptive of the second wave form and a first wave form, the first wave form corresponding to a first electrical oscillatory signal having the selected operating frequency, the second oscillatory signal having an average phase difference from the first oscillatory signal, the time signal means producing an initial time signal representative of the phase difference between the first and second oscillatory signals at a selected phase point in the time cycle and further producing a subsequent time signal representative of the phase difference between the first and second oscillatory signals at a subsequent phase point in the time cycle one half cycle later than the selected phase point; and summing means for combining the initial time signal and the subsequent time signal for each cycle to produce an output signal, whereby the output signal represents the average phase difference independently of the time-varying DC voltage.

* * * * *